US012243889B2

(12) United States Patent
Ozeki et al.

(10) Patent No.: US 12,243,889 B2
(45) Date of Patent: Mar. 4, 2025

(54) DETECTION DEVICE AND DISPLAY DEVICE

(71) Applicant: Japan Display Inc., Tokyo (JP)

(72) Inventors: Yoshitaka Ozeki, Tokyo (JP); Seiji Uejima, Tokyo (JP); Hiroyuki Watabe, Tokyo (JP)

(73) Assignee: Japan Display Inc., Tokyo (JP)

( * ) Notice: Subject to any disclaimer, the term of this patent is extended or adjusted under 35 U.S.C. 154(b) by 419 days.

(21) Appl. No.: 17/734,200

(22) Filed: May 2, 2022

(65) Prior Publication Data

US 2022/0262837 A1    Aug. 18, 2022

Related U.S. Application Data

(63) Continuation of application No. PCT/JP2020/034688, filed on Sep. 14, 2020.

(30) Foreign Application Priority Data

Nov. 18, 2019 (JP) ................................ 2019-207740

(51) Int. Cl.
H01L 27/146    (2006.01)
H01L 31/105    (2006.01)

(52) U.S. Cl.
CPC .. H01L 27/14621 (2013.01); H01L 27/14678 (2013.01); *H01L 27/14612* (2013.01); *H01L 31/1055* (2013.01)

(58) Field of Classification Search
CPC ......... H01L 27/14621; H01L 27/14678; H01L 27/14612; H01L 31/1055

USPC ........................................................ 257/173
See application file for complete search history.

(56) References Cited

U.S. PATENT DOCUMENTS

| | | | |
|---|---|---|---|
| 5,274,250 A | 12/1993 | Miyake et al. | |
| 2003/0156210 A1 | 8/2003 | Wako et al. | |
| 2005/0116271 A1 | 6/2005 | Kato | |
| 2007/0012863 A1* | 1/2007 | Han | H01L 27/14632 257/E27.134 |
| 2007/0241418 A1* | 10/2007 | Wang | H01L 27/14621 257/437 |
| 2010/0134397 A1 | 6/2010 | Ishitani et al. | |
| 2011/0043486 A1* | 2/2011 | Hagiwara | G02F 1/133514 345/207 |

(Continued)

FOREIGN PATENT DOCUMENTS

| | | |
|---|---|---|
| CN | 1624925 A | 6/2005 |
| JP | H05-183141 A | 7/1993 |

(Continued)

OTHER PUBLICATIONS

English translation of Office Action issued in related Japanese Patent Application No. 2019-207740 mailed on Nov. 28, 2023. 8 pages.

(Continued)

*Primary Examiner* — Igwe U Anya
(74) *Attorney, Agent, or Firm* — K&L Gates LLP

(57) ABSTRACT

According to one embodiment, a detection device includes a substrate, a photoelectric conversion element provided on the substrate and including a semiconductor layer, a transistor provided to correspond to the photoelectric conversion element, and a green color filter provided above the photoelectric conversion element.

13 Claims, 9 Drawing Sheets

(56) References Cited

U.S. PATENT DOCUMENTS

| | | |
|---|---|---|
| 2011/0109593 A1 | 5/2011 | Kurokawa et al. |
| 2011/0263083 A1 | 10/2011 | Yamazaki |
| 2011/0291013 A1 | 12/2011 | Kurokawa et al. |
| 2012/0299070 A1 | 11/2012 | Yamada et al. |
| 2014/0184810 A1 | 7/2014 | Sekiguchi |
| 2017/0220844 A1 | 8/2017 | Jones et al. |
| 2018/0038732 A1 | 2/2018 | Tateishi et al. |
| 2019/0098271 A1 | 3/2019 | Shen et al. |
| 2021/0012082 A1 | 1/2021 | Uchida et al. |

FOREIGN PATENT DOCUMENTS

| | | |
|---|---|---|
| JP | 2003-243640 A | 8/2003 |
| JP | 2004-207285 A | 7/2004 |
| JP | 2009-110452 A | 5/2009 |
| JP | 2009-212120 A | 9/2009 |
| JP | 2013-012696 A | 1/2013 |
| JP | 2013-157347 A | 8/2013 |
| JP | 2014-022675 A | 2/2014 |
| JP | 2014-127945 A | 7/2014 |
| JP | 2018-025408 A | 2/2018 |
| JP | 2019-512762 A | 5/2019 |
| JP | 2019-148814 A | 9/2019 |
| JP | 2019-174963 A | 10/2019 |
| JP | 2019-192921 A | 10/2019 |
| WO | WO2019/187729 A1 | 10/2019 |

OTHER PUBLICATIONS

International Search Report for International Patent Application No. PCT/JP2020/034688 mailed on Nov. 17, 2020 and English translation of same. 8 pages.

Written Opinion for International Patent Application No. PCT/JP2020/034688 mailed on Nov. 17, 2020. 8 pages.

Office Action issued in related Chinese Patent Application No. 202080078658.8 mailed on Aug. 24, 2024 and English translation of same. 28 pages.

* cited by examiner

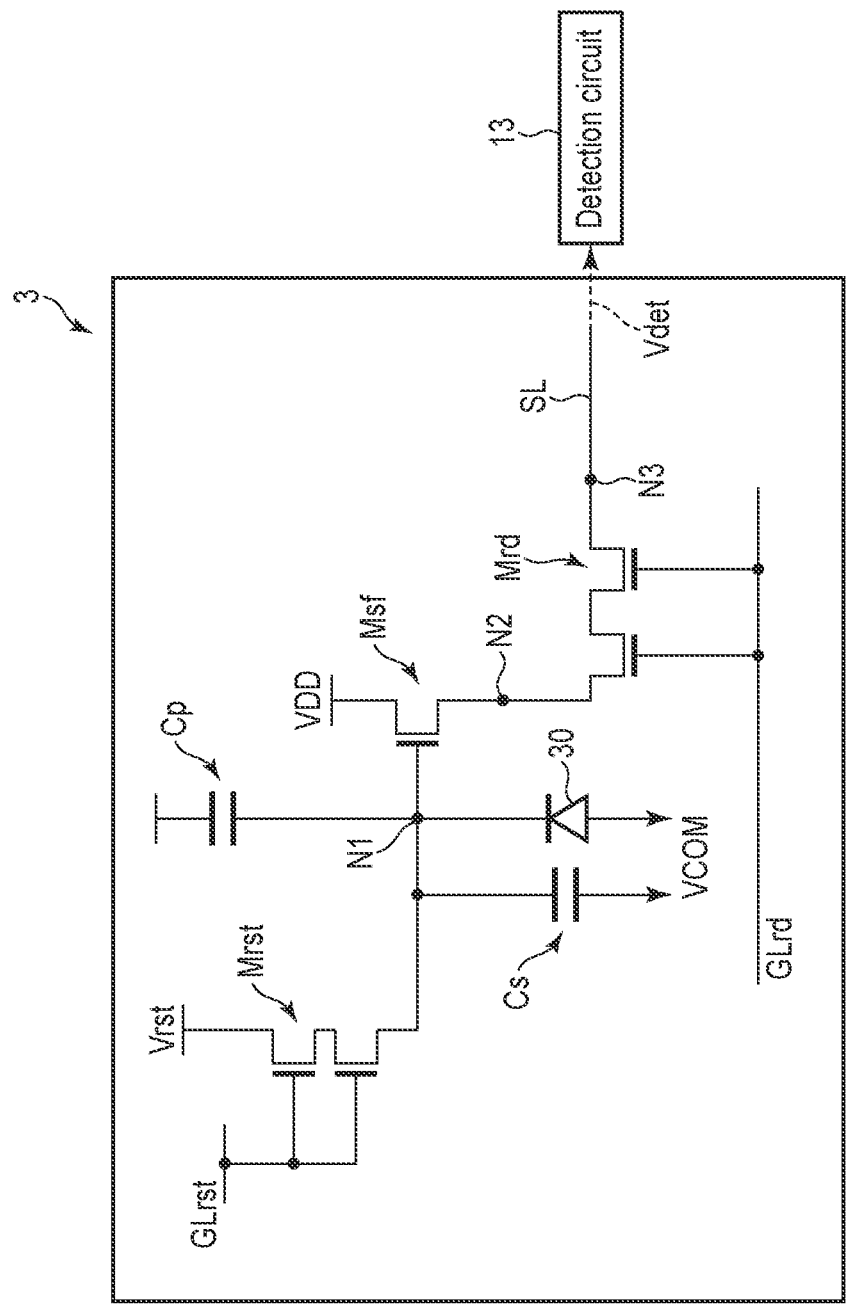
F I G. 3

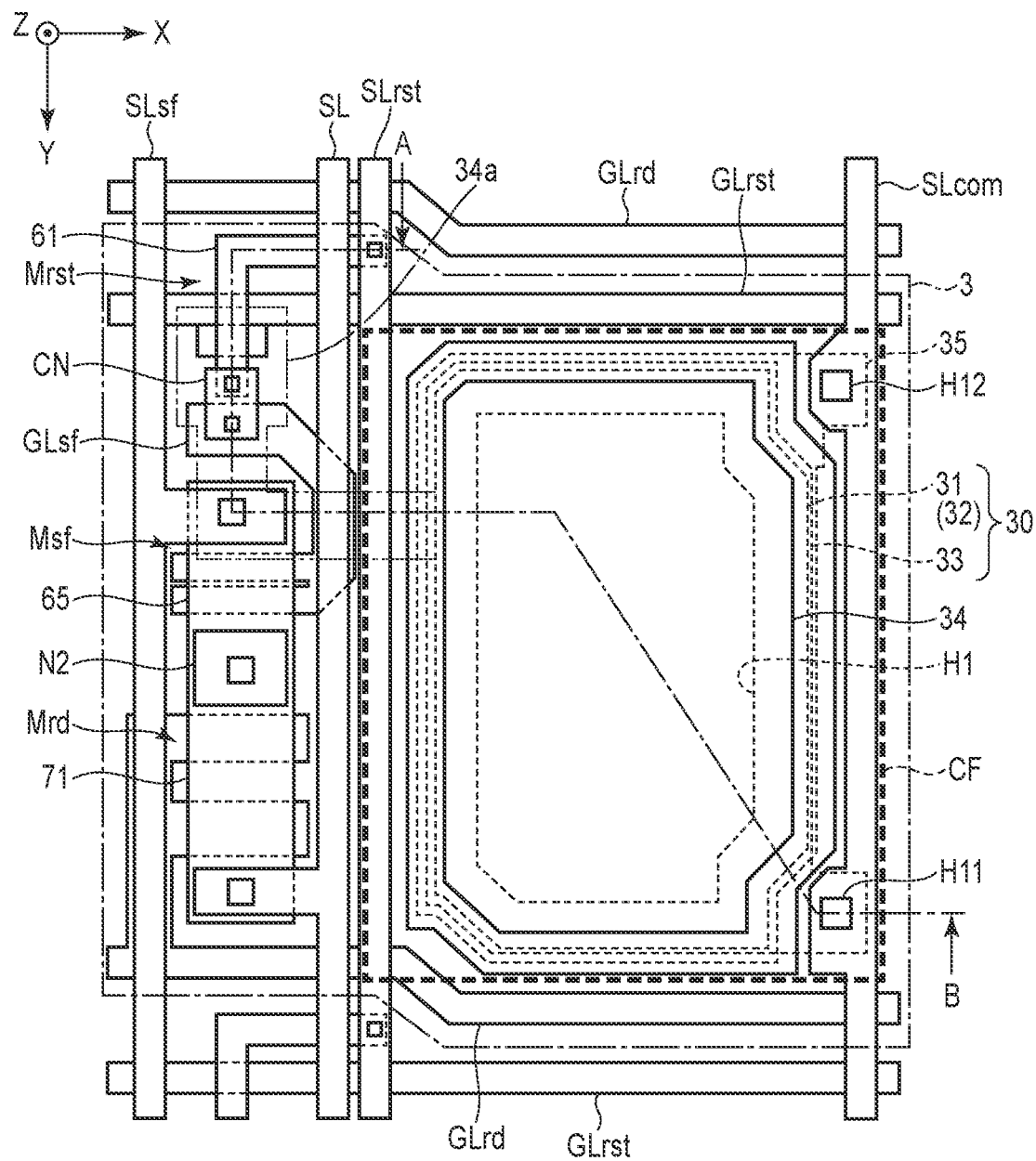
F I G. 8

DETECTION DEVICE AND DISPLAY DEVICE

CROSS-REFERENCE TO RELATED APPLICATIONS

This application is a Continuation application of PCT Application No. PCT/JP2020/034688, filed Sep. 14, 2020 and based upon and claiming the benefit of priority from Japanese Patent Application No. 2019-207740, filed Nov. 18, 2019, the entire contents of all of which are incorporated herein by reference.

FIELD

Embodiments described herein relate generally to a detection device and a display device.

BACKGROUND

An optical detection device includes, for example, a PIN photodiode as a photoelectric conversion element. As an example of a technique for providing a photoelectric conversion element on a substrate, it is known to provide a light-shielding layer between the substrate and a semiconductor layer to reduce the influence of an optical noise.

In recent years, the optical detection device has been used as a biosensor that detects biological information, such as a fingerprint sensor and a vein sensor. For detection devices mounted on outdoor-usable electronic devices such as a mobile terminal device, it is important to suppress a malfunction due to the influence of sunlight.

BRIEF DESCRIPTION OF THE DRAWINGS

FIG. 3 is a circuit diagram showing a detection element 3.

FIG. 8 is a plan view showing another example of the configuration of the detection element 3.

DETAILED DESCRIPTION

Figure 1:
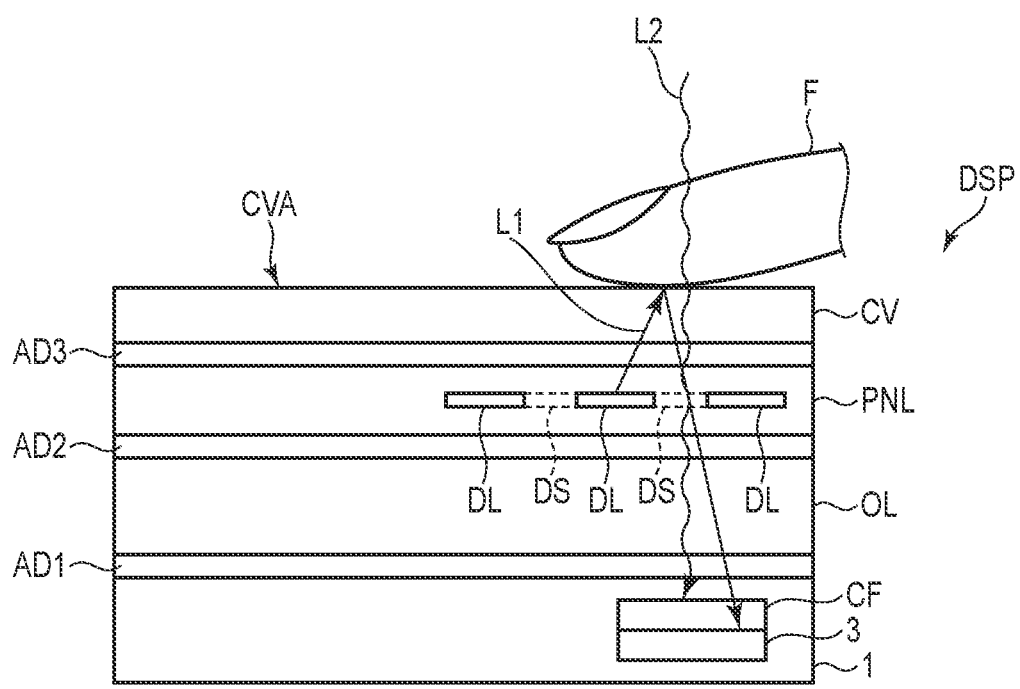
FIG. 1 is a sectional view showing an example of a configuration of a display device DSP including a detection device 1 of an embodiment.

In general, according to one embodiment, a detection device includes a substrate, a photoelectric conversion element provided on the substrate and including a semiconductor layer, a transistor provided to correspond to the photoelectric conversion element, and a green color filter provided above the photoelectric conversion element.

According to another embodiment, a display device includes a detection device, a display panel provided above the detection device, and a cover member provided on the display panel and having an upper surface. The display panel is configured to emit green illumination light toward the upper surface. The detection device includes a substrate, a photoelectric conversion element provided on the substrate and including a semiconductor layer, a transistor provided to correspond to the photoelectric conversion element, and a green color filter provided above the photoelectric conversion element. The detection device is configured to detect light reflected by an object, which is in contact with the upper surface, through the cover member, the display panel and the color filter.

According to one embodiment, there can be provided a detection device and a display device which are capable of suppressing a decrease in reliability.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

FIG. 1 is a sectional view showing an example of a configuration of a display device DSP including a detection device 1 of the present embodiment. The display device DSP includes the detection device 1, an optical layer OL, a display panel PNL and a cover member CV. In the configuration example shown in FIG. 1, the detection device 1 and the optical layer OL are bonded by an adhesive layer AD1, the optical layer OL and the display panel PNL are bonded by an adhesive layer AD2, and the display panel PNL and the cover member CV are bonded by an adhesive layer AD3. The adhesive layers AD1 to AD3 are transparent. The adhesive layers AD1 to AD3 may be excluded.

The optical layer OL is provided on the detection device 1. The optical layer OL is a lens layer for improving efficiency of incidence of light onto the detection device 1 by, for example, refracting the light, and includes a collimator and the like. Note that the optical layer OL may be excluded.

The display panel PNL is provided above the detection device 1 and provided on the optical layer OL. Note that the detection device 1 may be provided so as to overlap the entire surface of the display panel PNL or may be provided so as to overlap part of the display panel PNL. The display panel PNL is a display panel including a self-luminous display element DL such as an organic electroluminescent (EL) element, a micro-LED and a mini LED. The display panel PNL may also be a display panel including a display element DL such as a liquid crystal element and an electrophoretic element. In the display panel PNL, a gap DS capable of transmitting light is provided between a plurality of display elements DL. As the display elements DL, for example, light emitting elements that emit red light, green light and blue light are used.

The cover member CV is provided on the display panel PNL. The cover member CV is, for example, a glass substrate and a resin substrate. The cover member CV has an upper surface CVA that is in contact with an object such as a living body. The configuration example shown in FIG. 1 is a state in which finger F is in contact with the upper surface CVA.

The display panel PNL is configured to emit illumination light L1 of a predetermined color toward the upper surface CVA. For example, among the display elements DL provided in the display panel PNL, a light emitting element that emits light (green light) having a wavelength of 500 nm to 550 nm turns on to emit green illumination light L1 toward the upper surface CVA. The color of the illumination light L1 is not limited to green, but may be any other color such as blue and turquoise.

The detection device 1 includes a detection element 3 and is configured to detect light via the cover member CV, display panel PNL and optical layer OL. The detection element 3 is opposed to the gap DS between the display elements DL. For example, of the illumination light L1, light reflected by finger F is transmitted through the gap DS between the display elements DL, collimated in the optical layer OL, and detected by the detection device 1. Though the detection device 1 will be described in detail later, it is, for example, a light-reflecting biosensor, which can detect light reflected by finger F to detect irregularities (for example, a fingerprint) of the surface of finger F. In addition to detecting a fingerprint, the detection device 1 can also detect light reflected inside finger F to detect information regarding a living body. The information regarding a living body is, for example, an image of a blood vessel such as a vein, a pulse, and a pulse wave.

When the display device DSP is used outdoors, it is necessary to consider the influence of light L2 having a wavelength that transmits a living body among wavelengths contained in sunlight. It is known that living bodies easily transmit light in the wavelength range of 600 nm to 1100 nm. On the other hand, a photoelectric conversion element included in the detection element 3 can detect light in a wavelength range of approximately 400 nm to 800 nm, and has a peak of sensitivity in the vicinity of 550 nm to 600 nm. However, the photoelectric conversion element can hardly detect light in the wavelength range of 750 nm or longer, especially light in the wavelength range of 800 nm or longer (sensitivity 0). Considering the wavelength of light that is easily transmitted through a living body and the wavelength of light detected by the detection device 1, the light L2 in the wavelength range of 600 nm to 750 nm can be transmitted through a living body and may become an optical noise in the detection device 1. The optical noise is likely to cause the detection device 1 to malfunction and thus cause it to decrease in its reliability.

In the present embodiment, therefore, the detection device 1 includes a color filter CF between the detection element 3 and the display panel PNL. These structures will be described later.

Figure 2:
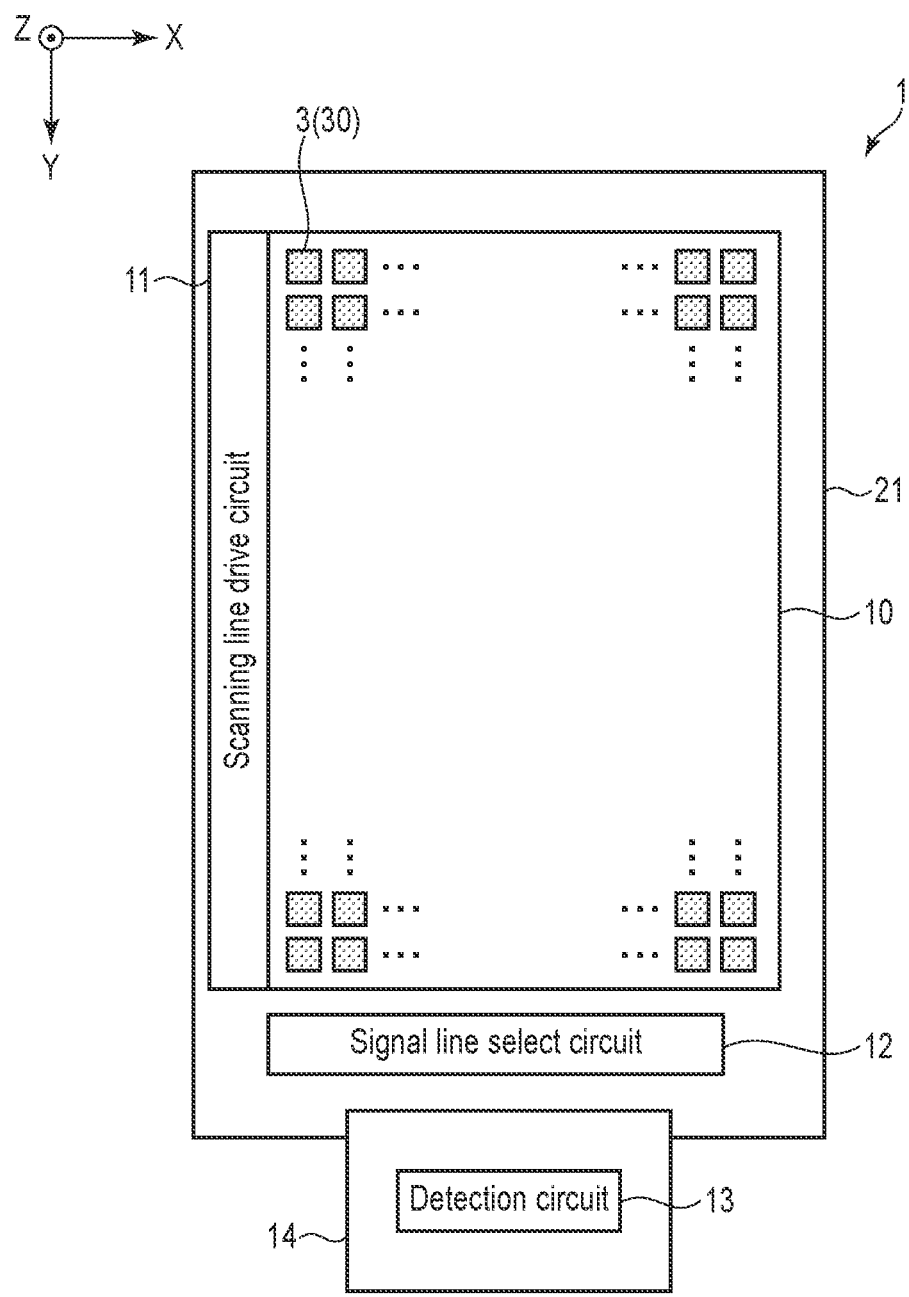
FIG. 2 is a diagram showing an example of the configuration of the detection device 1 shown in FIG. 1.

FIG. 2 is a diagram showing an example of the configuration of the detection device 1 shown in FIG. 1. The detection device 1 includes a substrate 21, a sensor unit 10, a scanning line drive circuit 11, a signal line select circuit 12 and a detection circuit 13. The detection circuit 13 is provided, for example, on a wiring substrate 14 that is electrically connected to the substrate 21, but may be provided on the substrate 21.

The sensor unit 10 includes a plurality of detection elements 3. The detection elements 3 are arranged in a matrix in first and second directions X and Y. The detection elements 3 are optical sensors each including a photoelectric conversion element 30. The photoelectric conversion element 30 is a photodiode which outputs an electrical signal corresponding to light to be emitted. More specifically, the photoelectric conversion element 30 is a positive intrinsic negative (PIN) photodiode. The photoelectric conversion element 30 performs detection in response to a gate drive signal (for example, a reset control signal RST and a read control signal RD) from the scanning line drive circuit 11. The photoelectric conversion element 30 outputs the electrical signal corresponding to the emitted light to the signal line select circuit 12 as a detection signal Vdet. The detection device 1 detects information regarding a living body based on detection signals Vdet from a plurality of photoelectric conversion elements 30.

Note that in this specification, the first direction X and the second direction Y are parallel to the substrate 21. The first direction X and the second direction Y may be orthogonal to each other or may intersect at an angle other than 90 degrees. In addition, a third direction Z is a direction orthogonal to the first direction X and the second direction Y, and is a normal direction of the substrate 21.

FIG. 3 is a circuit diagram showing a detection element 3. The detection element 3 includes a photoelectric conversion element 30, a first transistor (reset transistor) Mrst, a second transistor (read transistor) Mrd and a third transistor (source follower transistor) Msf. The detection element 3 also includes a first scanning line (reset control scanning line) GLrst and a second scanning line (read control scanning line) GLrd as detection drive lines (scanning lines), and includes a first signal line (output signal line) SL as a signal read line. The first and second scanning lines GLrst and GLrd are connected to the scanning line drive circuit 11 shown in FIG. 2. The first scanning line GLrst is a line to which a reset control signal RST is supplied, and the second scanning line GLrd is a line to which a read control signal RD is supplied. The first signal line SL is connected to the signal line select circuit 12 shown in FIG. 2. The signal line select circuit 12 is, for example, a multiplexer. The signal line select circuit 12 connects the selected first signal line SL to the detection circuit 13. Accordingly, the signal line select circuit 12 outputs the detection signal Vdet of the photoelectric conversion element 30 to the detection circuit 13.

Although one detection element 3 is shown in FIG. 3, the first scanning line GLrst, second scanning line GLrd and first signal line SL are connected to a plurality of detection elements 3. Specifically, the first and second scanning lines GLrst and GLrd extend in the first direction X shown in FIG. 2 and are connected to the detection elements 3 arranged in the first direction X. The first signal line SL extends in the second direction Y shown in FIG. 2 and is connected to the detection elements 3 arranged in the second direction Y.

The first, second and third transistors Mrst, Mrd and Msf are provided to correspond to one photoelectric conversion element 30. The transistors included in the detection element 3 are each configured by an n-type TFT (thin-film transistor) as one example; however, each of the transistors is not limited thereto, but may be configured by a p-type TFT.

A reference potential VCOM is applied to the anode of the photoelectric conversion element 30. The cathode of the photoelectric conversion element 30 is connected to a node N1. The node N1 is connected to a capacitive element Cs, one of the source and drain electrodes of the first transistor Mrst, and the gate electrode of the third transistor Msf. In addition, the node N1 has a parasitic capacitance Cp. When the photoelectric conversion element 30 is irradiated with light, the signals (charges) output from the photoelectric conversion element 30 are accumulated in the capacitive element Cs.

The gate electrode of the first transistor Mrst is connected to the first scanning line GLrst. The other of the source and drain electrodes of the first transistor Mrst is supplied with a reset potential Vrst. When the first transistor Mrst is turned on (brought into a conductive state) in response to the reset control signal RST, the potential of the node N1 is reset to the reset potential Vrst. The reference potential VCOM is lower than the reset potential Vrst, and the photoelectric conversion element 30 is driven by reverse bias.

The third transistor Msf is connected between a terminal to be supplied with a power supply potential VDD and the second transistor Mrd (node N2). The gate electrode of the third transistor Msf is connected to the node N1. The gate electrode of the third transistor Msf is supplied with a signal (charge) generated by the photoelectric conversion element 30. Accordingly, the third transistor Msf supplies the second transistor Mrd with a signal voltage corresponding to the signal (charge) generated by the photoelectric conversion element 30.

The second transistor Mrd is connected between the source electrode (node N2) of the third transistor Msf and the first signal line SL (node N3). The gate electrode of the second transistor Mrd is connected to the second scanning line GLrd. When the second transistor Mrd is turned on in response to the read control signal RD, a signal output from the third transistor Msf, that is, a signal voltage corresponding to the signal (charge) generated by the photoelectric conversion element 30, is output to the first signal line SL as the detection signal Vdet.

Note that in the example shown in FIG. 3, the first and second transistors Mrst and Mrd each have a so-called double-gate structure in which two transistors are connected in series. However, the first and second transistors Mrst and Mrd are not limited to the structure shown in FIG. 3, but may have a single-gate structure, and three or more transistors may be connected in series. In addition, the circuit of one detection element 3 is not limited to a configuration including three transistors of the first, second and third transistors Mrst, Mrd and Msf. The detection element 3 may include two transistors or four or more transistors.

Figure 4:
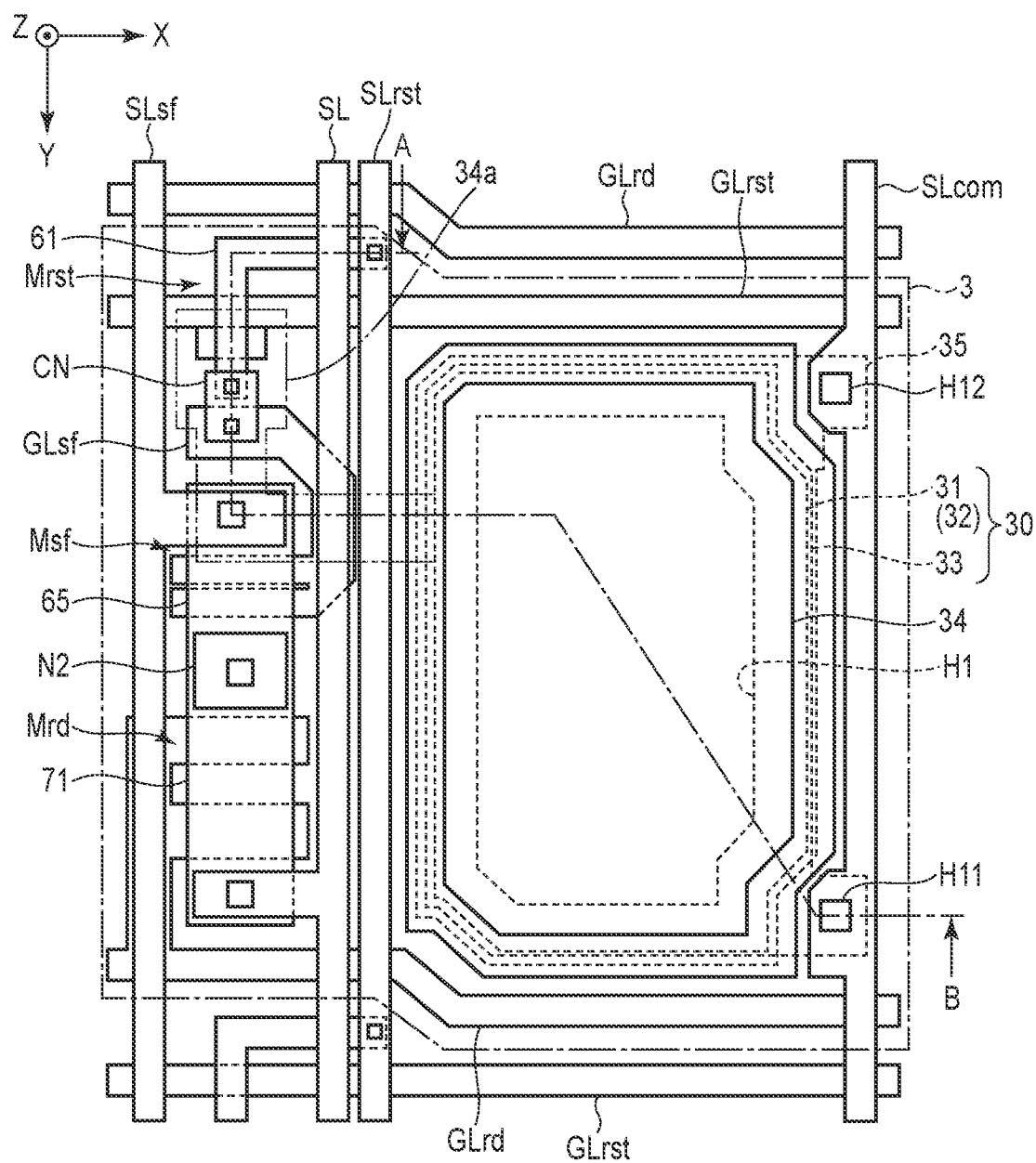
FIG. 4 is a plan view showing an example of a configuration of the detection element 3.

FIG. 4 is a plan view showing an example of a configuration of the detection element 3. The detection element 3 includes not only the photoelectric conversion element 30 but also two scanning lines (first and second scanning lines GLrst and GLrd) and four signal lines (first signal line SL, second signal line (power supply signal line) SLsf, third signal line (reset signal line) SLrst and fourth signal line (reference signal line) SLcom) in the range surrounded by a one-dot-one-dash line. The first and second scanning lines GLrst and GLrd extend in the first direction X and are arranged in the second direction Y. The second, first, third and fourth signal lines SLsf, SL, SLrst and SLcom extend in the second direction Y and are arranged in the first direction X in the order presented here. The second signal line SLsf is a signal line with the power supply potential VDD, the third signal line SLrst is a signal line with the reset potential Vrst, and the fourth signal line SLcom is a signal line with the reference potential VCOM.

The photoelectric conversion element 30 is provided in a region surrounded by the two scanning lines (first and second scanning lines GLrst and GLrd) and the two signal lines (third and fourth signal lines SLrst and SLcom). The photoelectric conversion element 30 includes a semiconductor layer having a photovoltaic effect. Specifically, the semiconductor layer of the photoelectric conversion element 30 includes an i-type semiconductor layer 31, an n-type semiconductor layer 32 and a p-type semiconductor layer 33. The i-type semiconductor layer 31 and n-type semiconductor layer 32 are formed of amorphous silicon (a-Si), for example, and the p-type semiconductor layer 33 is formed of polycrystalline silicon, for example. Note that the material of the semiconductor layer is not limited to these, and the amorphous silicon may be replaced with polycrystalline silicon, microcrystalline silicon, and the like, and the polycrystalline silicon may be replaced with amorphous silicon, microcrystalline silicon, and the like. In the n-type semiconductor layer 32, amorphous silicon is doped with impurities to form an $n^+$ region. In the p-type semiconductor layer 33, polycrystalline silicon is doped with impurities to form a $p^+$ region. The i-type semiconductor layer 31 is, for example, a non-doped intrinsic semiconductor and has conductivity that is lower than the n-type semiconductor layer 32 and the p-type semiconductor layer 33. The p-type semiconductor layer 33 is electrically connected to the fourth signal line SLcom through a contact hole H11. Accordingly, the p-type semiconductor layer 33 of the photoelectric conversion element 30 is supplied with the reference potential VCOM through the fourth signal line SLcom.

A lower electrode 35 is provided in a region overlapping the semiconductor layer of the photoelectric conversion element 30. The lower electrode 35 is electrically connected to the fourth signal line SLcom through a contact hole H12. Accordingly, the lower electrode 35 is supplied with the same reference potential VCOM as that of the p-type semiconductor layer 33 to make it possible to suppress parasitic capacitance between the lower electrode 35 and the p-type semiconductor layer 33.

The first, third and second transistors Mrst, Msf and Mrd are arranged in the second direction Y between the first and second signal lines SL and SLsf. The three transistors and the photoelectric conversion element 30 are adjacent to each other in the first direction X with the first and third signal lines SL and SLrst therebetween.

The first transistor Mrst includes a semiconductor layer 61. One end of the semiconductor layer 61 is electrically connected to the third signal line SLrst. The other end of the semiconductor layer 61 is electrically connected to a connection electrode CN. A portion of the third signal line SLrst, which is connected to the semiconductor layer 61, functions as a source electrode, and a portion of the connection electrode CN, which is connected to the semiconductor layer 61, functions as a drain electrode. The semiconductor layer 61 intersects the first scanning line GLrst. A portion of the first scanning line GLrst, which overlaps the semiconductor layer 61, functions as a gate electrode.

The third transistor Msf includes a semiconductor layer 65. One end of the semiconductor layer 65 is electrically connected to the second signal line SLsf. The other end of the semiconductor layer 65 is electrically connected to the node N2. A portion of the second signal line SLsf, which is connected to the semiconductor layer 65, functions as a drain electrode, and a portion of the node N2, which is connected to the semiconductor layer 65, functions as a source electrode. One end of the gate line GLsf is electrically connected to the connection electrode CN. The other end of the gate line GLsf has two branched portions arranged side by side in the second direction Y. The semiconductor layer 65 intersects the gate line GLsf branched into two portions. A portion of the gate line GLsf, which overlaps the semiconductor layer 65, functions as a gate electrode. That is, the first transistor Mrst is electrically connected to the gate electrode of the third transistor Msf through the connection electrode CN and the gate line GLsf.

The second transistor Mrd includes a semiconductor layer 71. In the configuration example shown in FIG. 4, the semiconductor layer 71 is formed integrally with the semiconductor layer 65, but may be separated from the semiconductor layer 65. One end of the semiconductor layer 71 is electrically connected to the node N2. The other end of the semiconductor layer 71 is electrically connected to the first signal line SL. A portion of the node N2, which is connected to the semiconductor layer 71, functions as a drain electrode, and a portion of the first signal line SL, which is connected to the semiconductor layer 71, functions as a source electrode. The second scanning line GLrd has two branched portions arranged side by side in the second direction Y. The semiconductor layer 71 intersects the two branched portions of the second scanning line GLrd. A portion of the second scanning line GLrd, which overlaps the semiconductor layer 71, functions as a gate electrode. In this configuration, the second and third transistors Mrd and Msf are electrically connected to the first signal line SL.

An upper electrode 34, which is provided on the photoelectric conversion element 30, is a transparent electrode and is electrically connected to the n-type semiconductor layer 32. A connection line 34a is formed integrally with the upper electrode 34 and electrically connected to the connection electrode CN. That is, the cathode (n-type semiconductor layer 32) of the photoelectric conversion element 30 is electrically connected to the first and third transistors Mrst and Msf through the upper electrode 34 and the connection electrode CN.

Note that the planar configuration of the photoelectric conversion element 30 and each transistor shown in FIG. 4 is merely an example and can be changed as appropriate. For example, the configuration is not limited to the side-by-side arrangement of a plurality of transistors in the second direction Y, but the transistors may be provided at different positions such as some transistors are adjacent to the other transistors in the first direction X.

Figure 5:
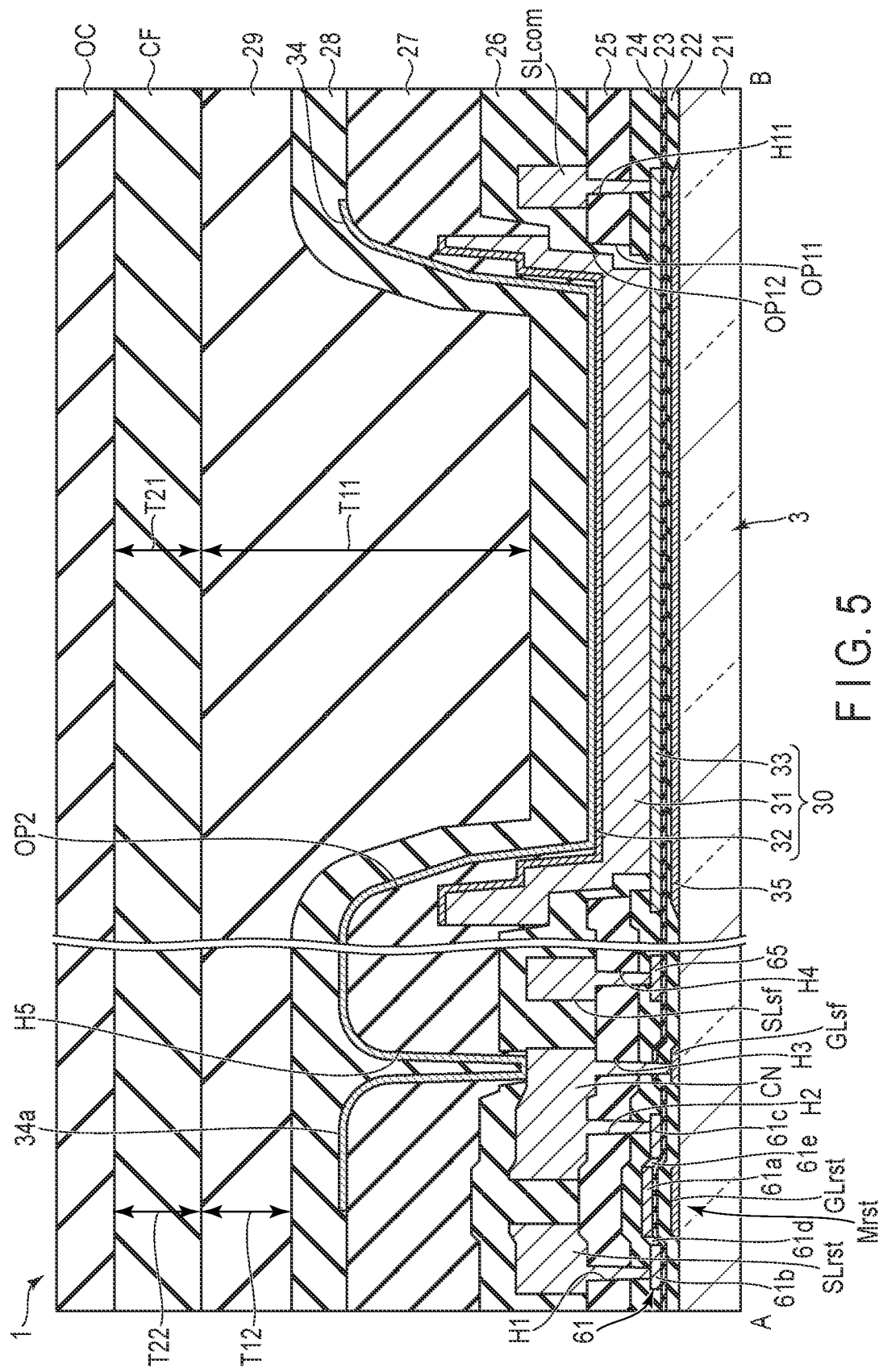
FIG. 5 is a sectional view taken along line A-B of FIG. 4.

FIG. 5 is a sectional view taken along line A-B of FIG. 4. FIG. 5 shows the sectional structure of the first transistor Mrst of the three transistors included in the detection element 3. The sectional structure of each of the second and third transistors Mrd and Msf is the same as that of the first transistor Mrst. The structure of the first transistor Mrst shown in FIG. 5 is a bottom gate structure in which the gate electrode is provided below the semiconductor layer; however, it may be a top gate structure in which the gate electrode is provided above the semiconductor layer and a dual gate structure in which the gate electrodes are provided above and below the semiconductor layer.

The substrate 21 is an insulating substrate such as a glass substrate and a resin substrate. The first scanning line GLrst and the gate line GLrf, each of which includes a portion functioning as a gate electrode, are provided on the substrate 21 and covered with an insulating film 22. An insulating film 23 is provided on the insulating film 22.

The semiconductor layer 61 is provided on the insulating film 23 and covered with an insulating film 24. An insulating film 25 is provided on the insulating film 24. The semiconductor layer 61 is, for example, polycrystalline silicon, but may be a microcrystalline oxide semiconductor, an amorphous oxide semiconductor, a low-temperature polycrystalline silicon, and the like. The semiconductor layer 61 includes a channel region 61a, high-concentration impurity regions 61b and 61c, and low-concentration impurity regions 61d and 61e. The channel region 61a is, for example, a non-doped intrinsic semiconductor or a low-impurity region, and has lower conductivity than the high-concentration impurity regions 61b and 61c and the low-concentration impurity regions 61d and 61e. The channel region 61a corresponds to a region of the semiconductor layer 61 which overlaps the first scanning line GLrst. The low-concentration impurity region 61d is provided between the channel region 61a and the high-concentration impurity region 61b, and the low-concentration impurity region 62e is provided between the channel region 61a and the high-concentration impurity region 61c.

The third signal line SLrst and the connection electrode CN are provided on the insulating film 25 and covered with an insulating film 26. As shown in FIG. 4, the first signal line SL is provided between the third signal line SLrst and the connection electrode CN in a region overlapping the semiconductor layer 61; however, the first signal line SL is not shown in FIG. 5.

The third signal line SLrst is in contact with the high-concentration impurity region 61b of the semiconductor layer 61 in the contact hole H1 penetrating the insulating films 24 and 25. In addition, the connection electrode CN is in contact with the high-concentration impurity region 61c of the semiconductor layer 61 in the contact hole H2 penetrating the insulating films 24 and 25. The connection electrode CN is in contact with the gate line GLsf in the contact hole H3 penetrating the insulating films 22 to 25.

The insulating films 22 to 26 are inorganic insulating films, and are formed of, for example, silicon oxide, silicon nitride, or the like.

Like the semiconductor layer 61, the semiconductor layer 65 of the third transistor Msf is provided on the insulating film 23 and covered with the insulating film 24. Like the third signal line SLrst and the connection electrode CN, the second signal line SLsf is provided on the insulating film 25 and covered with the insulating film 26. The second signal line SLsf is in contact with the semiconductor layer 65 in the contact hole H4 penetrating the insulating films 24 and 25.

The lower electrode 35 is provided on the substrate 21 and covered with the insulating film 22. The lower electrode 35 is formed of an untransparent metal material that is the same material as that of the first scanning line GLrst and the gate line GLsf. The photoelectric conversion element 30 is provided on the insulating film 23 and overlaps the lower electrode 35. The lower electrode 35 functions as a light shielding layer to prevent light transmitted through the substrate 21 from entering the photoelectric conversion element 30.

The i-type semiconductor layer 31 is provided between the p-type semiconductor layer 33 and the n-type semiconductor layer 32. In the present embodiment, the p-type semiconductor layer 33, i-type semiconductor layer 31 and n-type semiconductor layer 32 are stacked on the insulating film 23 in that order presented. Note that the n-type semiconductor layer 32, i-type semiconductor layer 31 and p-type semiconductor layer 33 may be stacked on the insulating film 23 in that order presented.

Specifically, like the semiconductor layers 61 and 65, the p-type semiconductor layer 33 is provided on the insulating film 23 and covered with the insulating films 24 to 26. The insulating films 24 and 25 have an opening OP11 which penetrates to the p-type semiconductor layer 33 at positions where insulating films 24 and 25 overlap the p-type semiconductor layer 33. The insulating film 26 covers a plurality of transistors including the first transistor Mrst and is provided on the insulating film 25. The insulating film 26 covers the side surfaces of the insulating films 24 and 25 that constitute the inner wall of the opening OP11. In addition, the insulating film 26 has an opening OP12 which penetrates to the p-type semiconductor layer 33 at a position where the insulating film 26 overlaps the p-type semiconductor layer 33. The i-type semiconductor layer 31 is provided on the insulating film 26 and is in contact with the p-type semiconductor layer 33 at the opening OP12. The n-type semiconductor layer 32 is provided on the i-type semiconductor layer 31 and is in contact with the i-type semiconductor layer 31.

An insulating film 27 is provided on the insulating film 26. The insulating film 27 also covers the photoelectric conversion element 30. That is, the insulating film 27 covers the i-type semiconductor layer 31 and the n-type semiconductor layer 32. The insulating film 27 also has an opening OP2 which penetrates to the n-type semiconductor layer 32. The insulating film 27 is a transparent organic insulating film and is formed of an organic material such as acrylic resin. The insulating film 27 is thicker than the insulating film 26.

The upper electrode 34 is provided on the insulating film 27 and covered with an insulating film 28. The upper electrode 34 is a transparent electrode that is formed of a transparent conductive material such as indium tin oxide. The upper electrode 34 is provided along the surface of the insulating film 27 and is in contact with the n-type semiconductor layer 32 at the opening OP2 formed in the insulating film 27. In addition, the connection line 34a extended from the upper electrode 34 is in contact with the connection electrode CN in the contact hole H5 formed in the insulating film 27, and is electrically connected to the gate line GLsf.

The insulating film 28 covers the upper electrode 34 and is provided on the insulating film 27. An insulating film 29 is provided on the insulating film 28. The insulating film 28 is a transparent inorganic insulating film. The insulating film 28 is provided as a protective layer to prevent moisture from entering the photoelectric conversion element 30. The insulating film 29 is a transparent organic insulating film. In a region where the insulating film 29 is in contact with the insulating film 28 and overlaps the photoelectric conversion element 30, the insulating film 29 is filled in a recess formed by the openings OP11 and OP12 and the opening OP2 to planarize the surface of the detection element 3. The thickness T11 of a region of the insulating film 29, which overlaps the photoelectric conversion element 30, is greater than the thickness T12 of a region thereof which overlaps the first transistor Mrst.

A color filter CF is a green color filter and is provided on the insulating film 29. The color filter CF is provided at least on the photoelectric conversion element 30. The color filter CF overlaps the openings OP11, OP12 and OP2. In the configuration example shown in FIG. 5, the color filter CF is provided not only on the photoelectric conversion element 30 but also on the first transistor Mrst to cover the entire detection element 3. In addition, the color filter CF is provided over the detection elements 3 shown in FIG. 2 to cover almost the entire sensor unit 10. In the color filter CF, the thickness T21 of the region overlapping the photoelectric conversion element 30 is almost equal to the thickness T22 of the region overlapping the first transistor Mrst.

An overcoat layer OC covers the color filter CF. The overcoat layer OC is a transparent organic insulating film. That is, the color filter CF is sandwiched between the insulating film 29 which is a transparent organic insulating film, and the overcoat layer OC which is a transparent organic insulating film.

Figure 6:
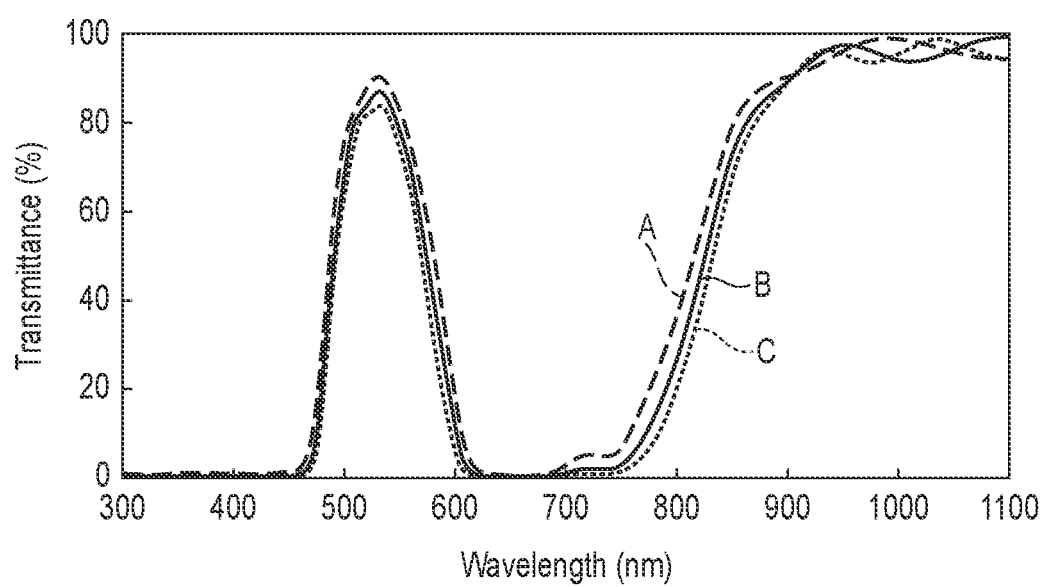
FIG. 6 is a graph showing an example of spectral characteristics of the color filter CF applicable to the embodiment.

FIG. 6 is a graph showing an example of spectral characteristics of the color filter CF applicable to the present embodiment. The horizontal axis indicates a wavelength (nm) and the vertical axis indicates a normalized transmittance (%). Here, three color filters CF having different thicknesses were prepared, and their spectral characteristics were measured. Note that all of the color filters are made of the same material. In the figure, A shows the spectral characteristics of a color filter CF having a thickness of 1.5 μm. In the figure, B shows the spectral characteristics of a color filter CF having a thickness of 2.0 μm. In the figure, C shows the spectral characteristics of a color filter CF having a thickness of 2.5 μm.

It was confirmed in all of the color filters CF that a transmittance of 60% or more was obtained in the wavelength range of 500 nm or more and 580 nm or less, and a transmittance of 80% or more was obtained in the wavelength range of approximately 520 nm or more and 550 nm or less.

It was also confirmed in color filters CF each having a thickness of 1.5 μm or more that the transmittance was 20% or less in the wavelength range of 600 nm or more and 750 nm or less. In particular, it was confirmed that the transmittance tended to decrease as the thickness of the color filter CF increased. In the color filter CF having a thickness of 2.0 μm or more, the transmittance was 10% or less in the wavelength range of 600 nm or more and 750 nm or less. Furthermore, in the color filter CF having a thickness of 2.5 μm or more, the transmittance was 20% or less in the wavelength range of 600 nm or more and 800 nm or less, and the transmittance was 10% or less in the wavelength range of 600 nm or more and 750 nm or less.

As described above, the green color filter CF has a high transmittance for light L1 of the wavelength detected by the photoelectric conversion element 30, and a high light-shielding property against light L2 of the wavelength which may be an optical noise when the light is transmitted through a living body.

If the thickness of a color filter CF is 3 μm or more, the transmittance of the color filter CF to the light L2 becomes approximately zero, whereas it is concerned that the transmittance of the color filter CF to the light L1 decreases. Thus, the thickness of the color filter CF is preferably 3 μm or less.

According to the present embodiment, the color filter CF is provided between the photoelectric conversion element 30 and the display panel PNL to transmit green light reflected by a living body and shield external light transmitted through the living body. Thus, a malfunction in the detection device 1 caused by external light is suppressed. Therefore, the detection device can be prevented from decreasing in its reliability.

The color filter CF is provided between the insulating film 29 which is a transparent organic insulating film, and the overcoat layer OC which is a transparent organic insulating film. Therefore, even though the color filters CF contain impurities that adversely affect the performance of the photoelectric conversion element 30, transistors and the like, the impurities can be prevented from leaking.

As a comparative example, when a generally-used IR cut filter is provided between the optical layer OL and the display panel PNL instead of the color filter CF, the IR cut filter has a thickness of several hundred microns. It is also necessary to add an adhesive layer for bonding the IR cut filter.

According to the present embodiment, the color filter CF having a thickness of several micromicrons (μm) is provided, light-shielding performance equivalent to that of the IR cut filter can be obtained, and an adhesive layer for bonding the IR cut filter can be omitted. Therefore, the present embodiment can reduce the total thickness of the display device DSP more than that in the comparative example. The present embodiment can also reduce the number of members and decrease the costs more than those in the comparative example.

Figure 7:
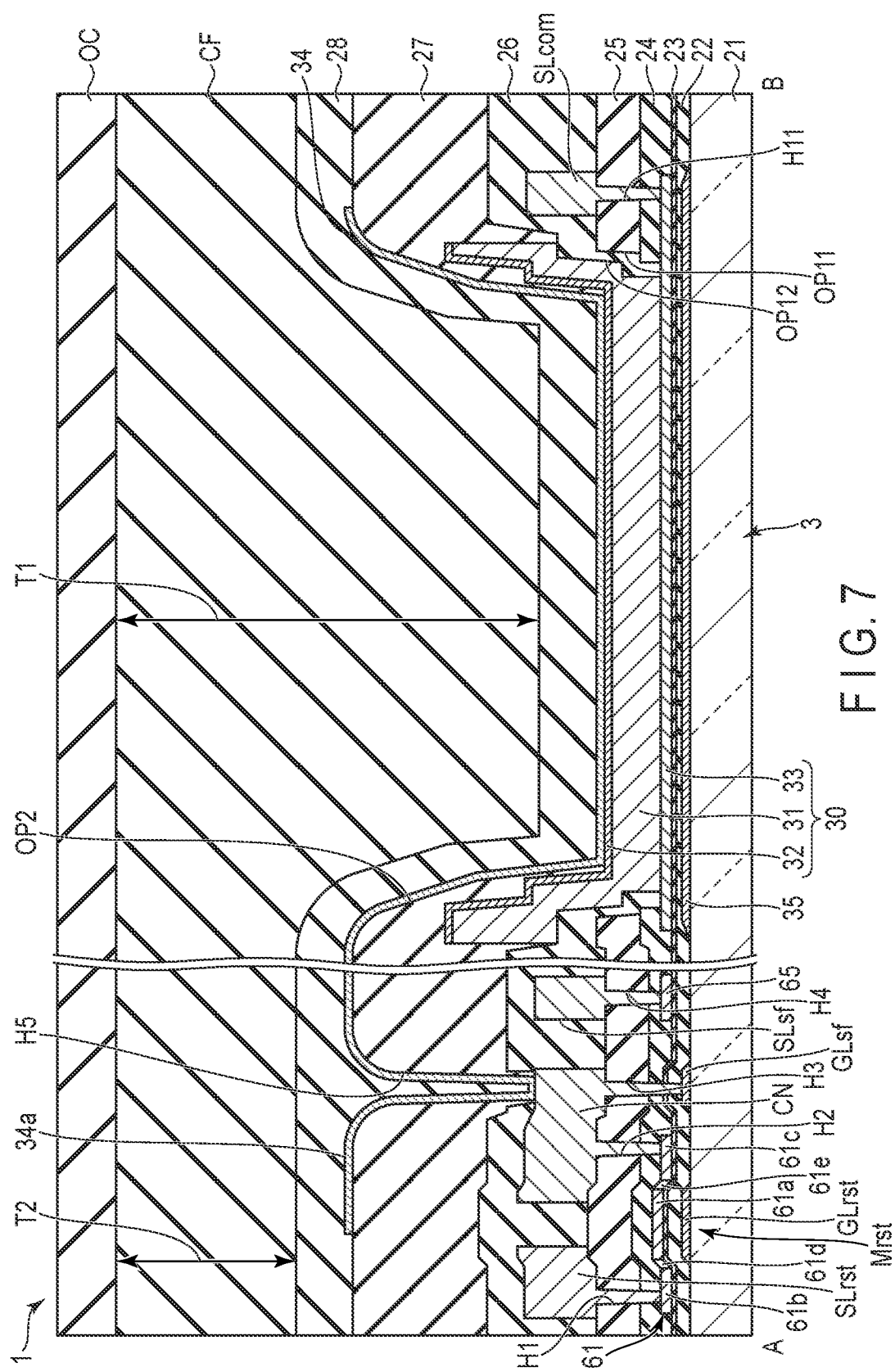
FIG. 7 is a sectional view showing another example of the configuration of the detection element 3.

FIG. 7 is a sectional view showing another example of the configuration of the detection element 3. FIG. 7 corresponds to a sectional view taken along line A-B in FIG. 4. The configuration example shown in FIG. 7 differs from that shown in FIG. 5 in that the insulating film 29 is excluded and the color filter CF is provided directly on the insulating film 28. That is, the color filter CF is into contact with the insulating film 28 which is an inorganic insulating film, and is covered with the overcoat layer OC. The color filter CF is filled in a recess formed by the openings OP11 and OP12 and the opening OP2 in a region overlapping the photoelectric conversion element 30, and is formed so as to planarize the surface of the detection element 3. In the color filter CF, the thickness T1 of the region overlapping the photoelectric conversion element 30 is larger than the thickness T2 of the region overlapping the first transistor Mrst.

This configuration example also brings about the same advantages as those in the foregoing configuration example. In addition, since the color filter CF is provided so as to planarize the surface of the detection element 3, the thickness T1 of the region overlapping the photoelectric conversion element 30 is increased, with the result that a high light-shielding property against an optical noise can be achieved.

Since, furthermore, the insulating film 29 is excluded, the manufacturing process is simplified and the manufacturing costs can be reduced.

FIG. 8 is a plan view showing another example of the configuration of the detection element 3. The configuration example shown in FIG. 8 differs from that shown in FIG. 5 in that the color filter CF is provided in the region overlapping the photoelectric conversion element 30 and is not provided in the region overlapping the first transistor Mrst. In the configuration example shown in FIG. 8, the color filter CF is provided in a region surrounded by the first and second scanning lines GLrst and GLrd and the third and fourth signal lines SLrst and SLcom. In addition, the color filter CF overlaps the entire photoelectric conversion element 30 and overlaps the third and fourth signal lines SLrst and SLcom. The color filter CF overlaps neither the first transistor Mrst nor the second and third transistors Mrd and Msf.

Figure 9:
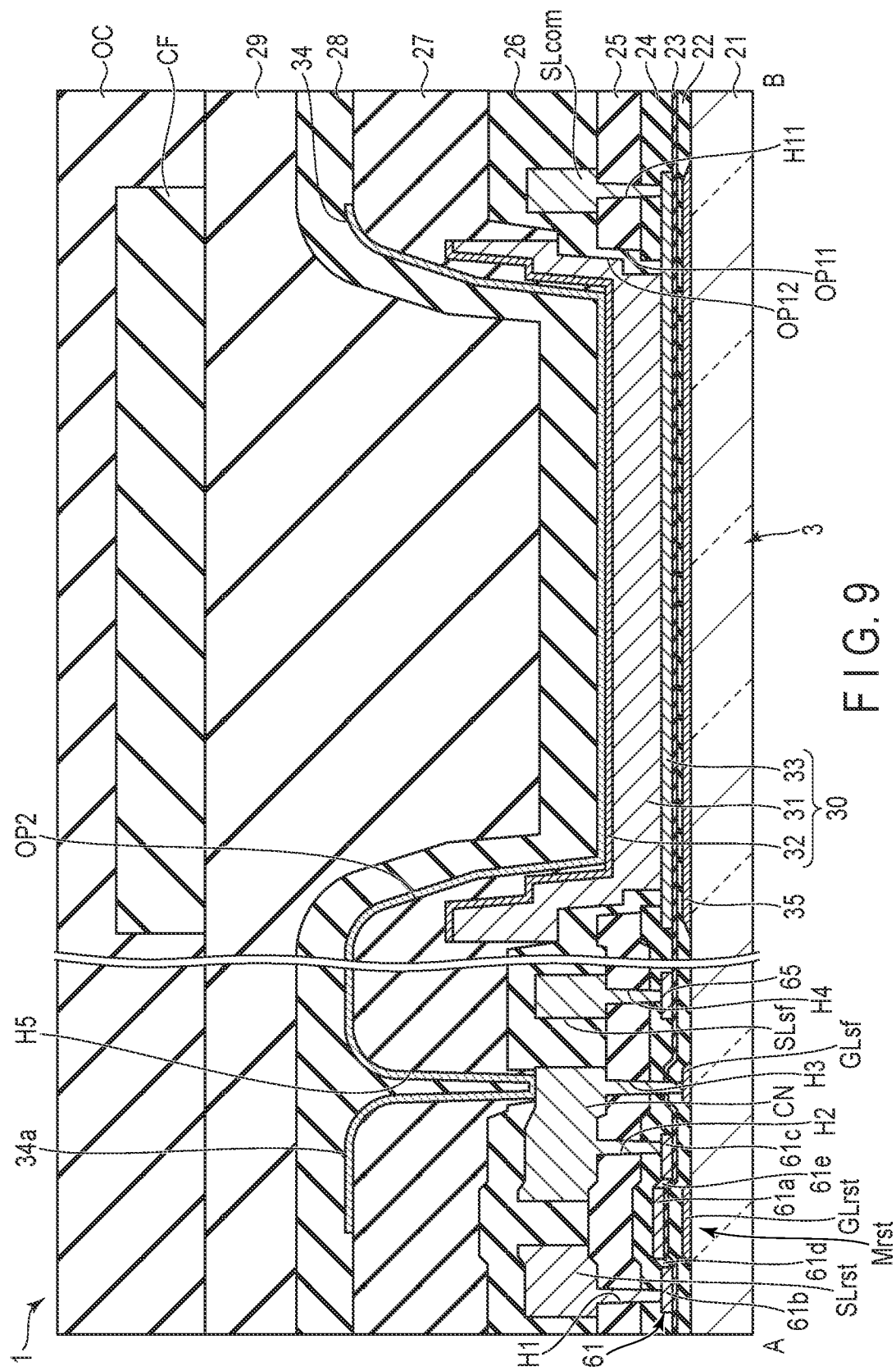
FIG. 9 is a sectional view showing another example of the configuration of the detection element 3.

FIG. 9 is a sectional view showing another example of the configuration of the detection element 3. FIG. 9 corresponds to a sectional view taken along line A-B of FIG. 8. The color filter CF is formed in an island shape on the insulating film 29 and overlaps the photoelectric conversion element 30. The overcoat layer OC covers the color filter CF in a region overlapping the photoelectric conversion element 30, and is in contact with the insulating film 29 in a region overlapping the first transistor Mrst.

This configuration example also brings about the same advantages as those in the foregoing configuration examples. In the configuration examples shown in FIGS. 8 and 9, the color filter CF is provided on the insulating film 29; however, as in the configuration example described with reference to FIG. 7, the insulating film 29 may be excluded and the color filter CF may be filled in a recess in the region overlapping the photoelectric conversion element 30.

In the foregoing embodiment, for example, the insulating film 29 corresponds to a first organic insulating film and the overcoat layer OC corresponds to a second organic insulating film. The insulating films 24 to 26 correspond to a first insulating film, and the insulating film 27 corresponds to a second insulating film. The openings OP11 and OP12 correspond to a first opening and the opening OP2 corresponds to a second opening.

As described above, the present embodiment makes it possible to provide a detection device and a display device which are capable of suppressing a decrease in reliability.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A detection device comprising:
a substrate;
a photoelectric conversion element provided on the substrate and including a semiconductor layer;
a transistor provided to correspond to the photoelectric conversion element;
a color filter being a green color filter and provided above the photoelectric conversion element;
a first organic insulating film provided above the photoelectric conversion element and the transistor; and
a second organic insulating film opposing the first organic insulating film,
wherein the color filter is provided between the first organic insulating film and the second organic insulating film.

2. The detection device of claim 1, wherein the first organic insulating film and the second organic insulating film are in contact with each other in a region overlapping the transistor.

3. The detection device of claim 1, wherein the color filter is provided in a region surrounded by two scanning lines and two signal lines in planar view.

4. The detection device of claim 1, wherein the color filter has a transmittance of 20% or less in a wavelength range of 600 nm or more and 750 nm or less.

5. The detection device of claim 4, wherein the color filter has a thickness of 1.5 µm or more.

6. The detection device of claim 1, wherein the color filter is provided above the transistor.

7. The detection device of claim 6, wherein in the color filter, a thickness of a region overlapping the photoelectric conversion element is larger than a thickness of a region overlapping the transistor.

8. A detection device comprising:
a substrate;
a photoelectric conversion element provided on the substrate and including a semiconductor layer;
a transistor provided to correspond to the photoelectric conversion element;
a color filter being a green color filter and provided above the photoelectric conversion element;
a first insulating film covering the transistor; and
a second insulating film provided on the first insulating film,
wherein
the semiconductor layer of the photoelectric conversion element includes:

a p-type semiconductor layer provided on the substrate and covered with the first insulating film,
an i-type semiconductor layer that is in contact with the p-type semiconductor layer at a first opening formed in the first insulating film, and
an n-type semiconductor layer provided on the i-type semiconductor layer,
the second insulating film is an organic insulating film, covers the i-type semiconductor layer and the n-type semiconductor layer, and has a second opening which penetrates to the n-type semiconductor layer, and
the color filter overlaps the second opening.

9. The detection device of claim 8,
the p-type semiconductor layer is formed of polycrystalline silicon, and
the i-type semiconductor layer and the n-type semiconductor layer are formed of amorphous silicon.

10. The detection device of claim 9, further comprising a transparent electrode which electrically connects the n-type semiconductor layer and the transistor.

11. A display device comprising:
a detection device;
a display panel provided above the detection device;
a cover member provided on the display panel and having an upper surface;
a first organic insulating film provided above the photoelectric conversion element and the transistor; and
a second organic insulating film opposing the first organic insulating film,
wherein
the display panel is configured to emit green illumination light toward the upper surface,
the detection device includes:
a substrate,
a photoelectric conversion element provided on the substrate and including a semiconductor layer,
a transistor provided to correspond to the photoelectric conversion element, and
a color filter being a green color filter and provided above the photoelectric conversion element,
the detection device is configured to detect light reflected by an object which is in contact with the upper surface, through the cover member, the display panel and the color filter,
the color filter is provided between the first organic insulating film and the second organic insulating film, and
in the first organic insulating film, a thickness of a region overlapping the photoelectric conversion element is larger than a thickness of a region overlapping the transistor.

12. A display device comprising:
a detection device;
a display panel provided above the detection device;
a cover member provided on the display panel and having an upper surface;
a first organic insulating film provided above the photoelectric conversion element and the transistor; and
a second organic insulating film opposing the first organic insulating film,
wherein
the display panel is configured to emit green illumination light toward the upper surface,
the detection device includes:
a substrate,
a photoelectric conversion element provided on the substrate and including a semiconductor layer,
a transistor provided to correspond to the photoelectric conversion element, and
a color filter being a green color filter and provided above the photoelectric conversion element,
the detection device is configured to detect light reflected by an object which is in contact with the upper surface, through the cover member, the display panel and the color filter,
the color filter is provided between the first organic insulating film and the second organic insulating film, and
the first organic insulating film and the second organic insulating film are in contact with each other in a region overlapping the transistor.

13. A display device comprising:
a detection device;
a display panel provided above the detection device; and
a cover member provided on the display panel and having an upper surface,
wherein
the display panel is configured to emit green illumination light toward the upper surface,
the detection device includes:
a substrate,
a photoelectric conversion element provided on the substrate and including a semiconductor layer,
a transistor provided to correspond to the photoelectric conversion element, and
a color filter being a green color filter and provided above the photoelectric conversion element,
the detection device is configured to detect light reflected by an object which is in contact with the upper surface, through the cover member, the display panel and the color filter,
the display panel includes a plurality of self-luminous display elements which emit the illumination light, and
the detection device is opposed to a gap between the display elements.

* * * * *